United States Patent
Li (10) Patent No.: US 10,930,785 B2
(45) Date of Patent: Feb. 23, 2021

(54) SEMICONDUCTOR DEVICE (71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/835,526

(22) Filed: Mar. 31, 2020

(65) Prior Publication Data
US 2020/0227559 A1    Jul. 16, 2020

Related U.S. Application Data (62) Division of application No. 16/040,100, filed on Jul. 19, 2018, now Pat. No. 10,741,689.

(30) Foreign Application Priority Data

Jul. 20, 2017   (CN) .......................... 201710595707.5

(51) Int. Cl.
*H01L 29/78* (2006.01)
*H01L 29/04* (2006.01)
(Continued)

(52) U.S. Cl.
CPC ........ *H01L 29/7853* (2013.01); *H01L 21/762* (2013.01); *H01L 21/76802* (2013.01);
(Continued)

(58) Field of Classification Search
CPC . H01L 51/56; H01L 51/0072; H01L 51/0097; H01L 51/5253; C09K 11/06
(Continued)

(56) References Cited

U.S. PATENT DOCUMENTS 9,064,814 B2   6/2015  Wu et al.
2013/0187151 A1  7/2013  Yamazaki
(Continued)

FOREIGN PATENT DOCUMENTS

CN   103378156 A   10/2013
CN   105762108 A    7/2016
(Continued)

*Primary Examiner* — Andy Huynh
(74) *Attorney, Agent, or Firm* — Anova Law Group, PLLC (57) ABSTRACT

A semiconductor device is provided. The semiconductor device includes a base substrate; a first dielectric layer on the base substrate; a target gate structure in the first dielectric layer and on the base substrate. The target gate structure includes a target structure body and a target spacer wall on sidewalls of the target gate structure body. The semiconductor device further includes a protective layer on a top surface of the target gate structure, in the first dielectric layer. The semiconductor device further includes conductive plugs in the first dielectric layer on sides of the target gate structure and the protective layer.

12 Claims, 5 Drawing Sheets

(51) Int. Cl.
| | |
|---|---|
| *H01L 29/10* | (2006.01) |
| *H01L 29/66* | (2006.01) |
| *H01L 21/762* | (2006.01) |
| *H01L 29/06* | (2006.01) |
| *H01L 21/768* | (2006.01) |
| *H01L 21/84* | (2006.01) |
| *H01L 27/088* | (2006.01) |
| *H01L 21/8234* | (2006.01) |
| *H01L 29/08* | (2006.01) |

(52) U.S. Cl.
CPC .. *H01L 21/76834* (2013.01); *H01L 21/76897* (2013.01); *H01L 21/823431* (2013.01); *H01L 21/845* (2013.01); *H01L 27/0886* (2013.01); *H01L 29/045* (2013.01); *H01L 29/0642* (2013.01); *H01L 29/1054* (2013.01); *H01L 29/6681* (2013.01); *H01L 29/66795* (2013.01); *H01L 29/785* (2013.01); *H01L 29/0847* (2013.01)

(58) Field of Classification Search
USPC .......................................................... 257/288
See application file for complete search history.

(56) References Cited

U.S. PATENT DOCUMENTS

| | | | |
|---|---|---|---|
| 2015/0187896 A1* | 7/2015 | Kamineni | H01L 29/41791 |
| | | | 257/288 |
| 2016/0049495 A1 | 2/2016 | Trevino et al. | |
| 2016/0079241 A1 | 3/2016 | Kim et al. | |
| 2016/0149036 A1 | 5/2016 | Huang et al. | |
| 2016/0365449 A1 | 12/2016 | Chang et al. | |

FOREIGN PATENT DOCUMENTS

| | | |
|---|---|---|
| CN | 106252411 A | 12/2016 |
| JP | 2002198521 A | 7/2002 |

\* cited by examiner

SEMICONDUCTOR DEVICE

CROSS-REFERENCES TO RELATED APPLICATION

This application is a divisional of U.S. patent application Ser. No. 16/040,100 filed on Jul. 19, 2018, which claims the priority of Chinese Patent Application No. 201710595707.5, filed on Jul. 20, 2017, the content of which is incorporated by reference in its entirety.

TECHNICAL FIELD

The present disclosure generally relates to the field of semiconductor technologies and, more particularly, relates to a semiconductor device and its fabrication method.

BACKGROUND

A metal-oxide-semiconductor (MOS) transistor is one of the most important devices in modern integrated circuits. A MOS transistor usually includes a semiconductor substrate, gate structures on a top surface of the semiconductor substrate, and sour/drain doped regions in the semiconductor substrate on two sides of each gate structure. Each gate structure includes a gate dielectric layer on the top surface of the semiconductor substrate, and a gate electrode layer on the gate dielectric layer.

In a MOS transistor, a voltage is applied to a gate structure, to regulate channel currents under the gate structure and generate on/off signals.

However, semiconductor devices formed by the MOS transistors in the current technology have poor performances.

SUMMARY

One aspect of the present disclosure provides a fabrication method of a semiconductor device. The method includes: providing a base substrate; forming a first dielectric layer on the base substrate; forming a target gate structure in the first dielectric layer and on the base substrate, where a first groove is formed above the target gate structure and in the first dielectric layer; forming a second groove by etching the first dielectric layer on sidewalls of the first groove to expand an opening of the first groove; forming a protective layer in the second groove; and forming conductive plugs in the first dielectric layer on sides of the target gate structure and the protective layer. The protective layer has a dielectric constant greater than the first dielectric layer.

Another aspect of the present disclosure provides a semiconductor device. The device includes: a base substrate; a first dielectric layer on the base substrate; a target gate structure in the first dielectric layer and on the base substrate; a protective layer on a top surface of the target gate structure, in the first dielectric layer; and conductive plugs in the first dielectric layer on sides of the target gate structure and the protective layer. The protective layer has a surface area covering and surrounding the top surface of the target gate structure. The protective layer has a dielectric constant greater than the first dielectric layer.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
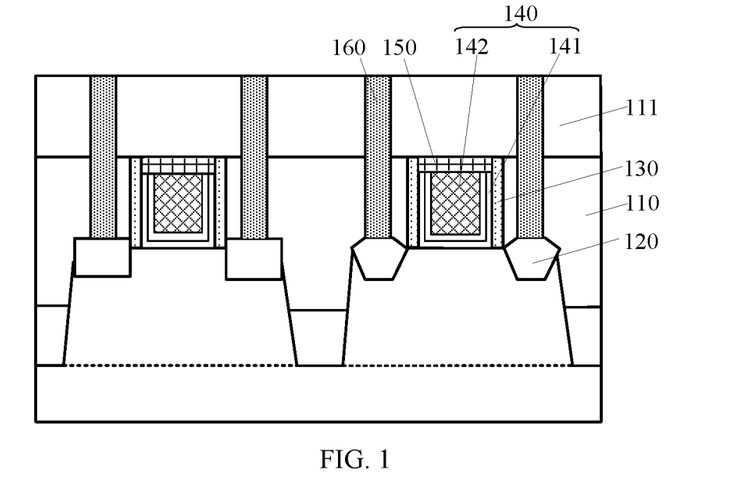
FIG. 1 illustrates a semiconductor device.

FIG. 1 illustrates a semiconductor device. The semiconductor device may include: a base substrate; gate structures 140 on the base substrate; a protective layers 150 on a top surface of each gate structure 140; a spacer wall 130 on sidewalls of each gate structure 140 and on sidewalls of the adjacent protective layer 150; source/drain doped regions 120 on two sides of each gate structure 140 and the adjacent spacer wall 130; a first dielectric layer 110 on the base substrate and on the source/drain doped regions 120; a second dielectric layer 111 on the first dielectric layer 110 and on the protective layers 150; contact holes through the second dielectric layer 111 and through first dielectric layer 110 to expose the source/drain doped regions 120; and a conductive plug 160 in each contact hole. Each gate structure 140 may include a gate dielectric layer 141 on the base substrate, and a gate electrode layer 142 on the gate dielectric layer 141.

However, as critical dimensions of the semiconductor device decrease, a distance between a conductive plug 160 and the adjacent gate structure 140 continuously decreases. When forming the contact holes by an etching process, more by-products may accumulate in an etching region, preventing etching gas from entering the etching region. Correspondingly, each contact hole has a top size greater than a bottom size, along a width direction of the gate structure 140. A distance between a top region of sidewalls of the gate structure 140 and the adjacent contact hole becomes smaller, and an electrical field between a top region of sidewalls of the gate structure 140 and the adjacent contact hole becomes larger. A region between a top region of sidewalls of the gate structure 140 and the adjacent contact hole may break down easily, causing leakage currents.

The present disclosure provides a semiconductor device and a fabrication method of the semiconductor device. An exemplary method may include: providing a base substrate; forming a first dielectric layer on the base substrate; forming target gate structures in the first dielectric layer and on the base substrate; forming a first groove above each target gate structure and in the first dielectric layer; forming a second groove by etching the first dielectric layer on sidewalls of each first groove to expand an opening of the first groove; forming a protective layer in each second groove; and forming conductive plugs in the first dielectric layer on sides of each target gate structure and the adjacent protective layer. The protective layers may have a dielectric constant greater than the first dielectric layer.

Figure 9:
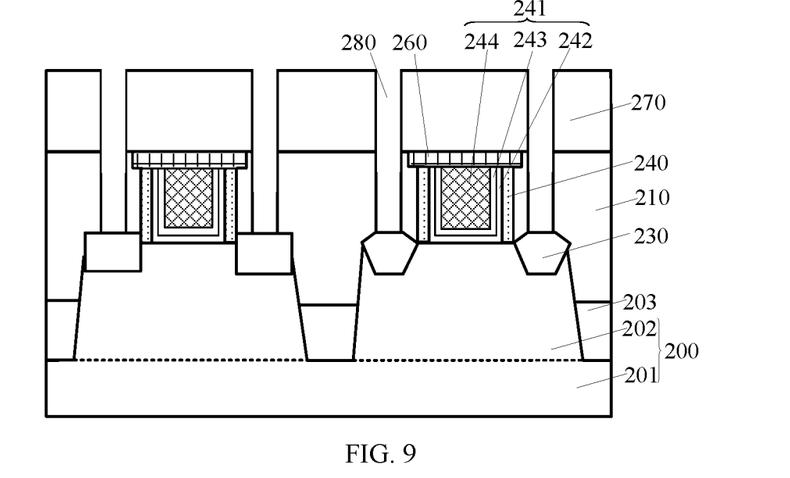
Figure 10:
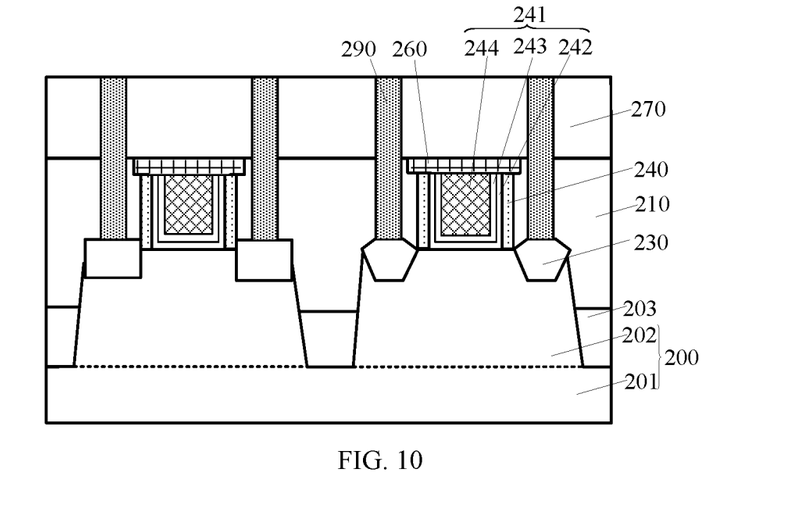
Figure 11:
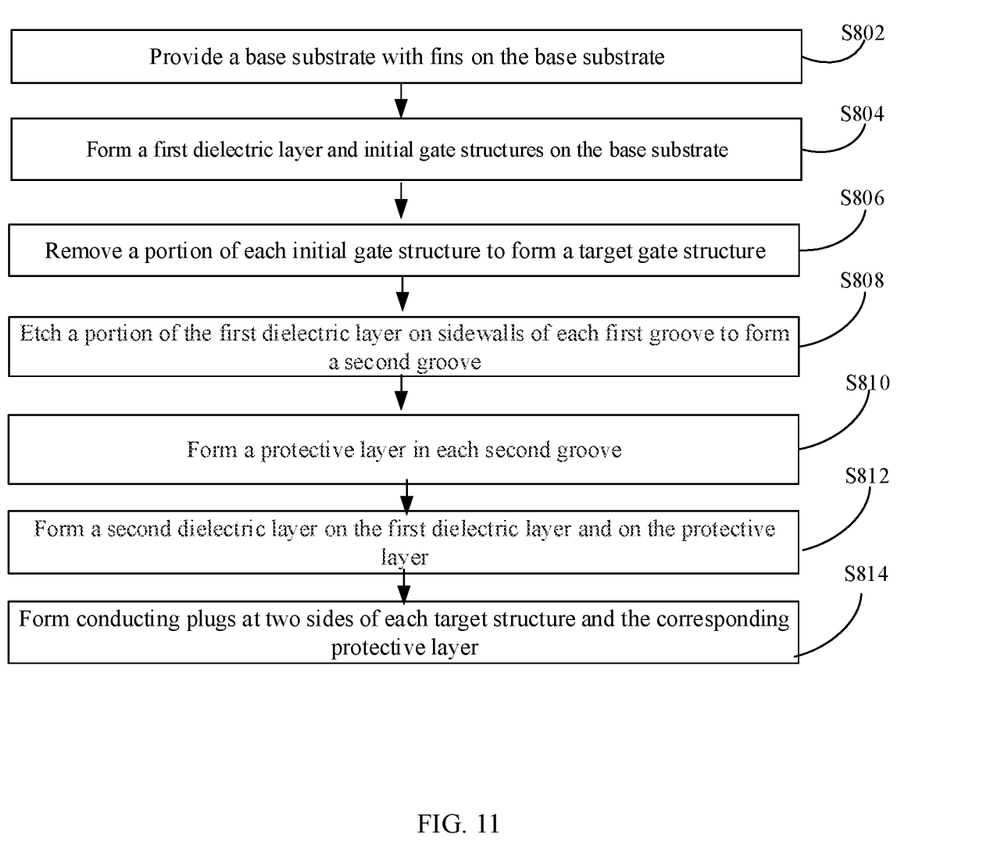
FIG. 11 illustrates an exemplary method for forming a semiconductor device according to various disclosed embodiments of the present disclosure.

FIGS. 2-10 illustrate semiconductor structures corresponding to certain stages for forming an exemplary semiconductor device according to various disclosed embodiments of the present disclosure; and FIG. 11 illustrates an exemplary method for forming a semiconductor device according to various disclosed embodiments of the present disclosure.

Figure 2:
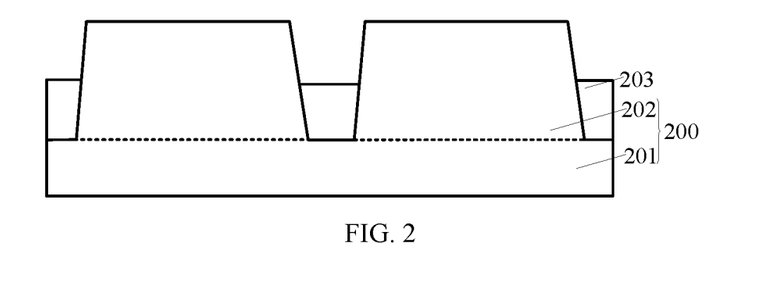
FIGS. 2-10 illustrate semiconductor structures corresponding to certain stages for forming an exemplary semiconductor device according to various disclosed embodiments of the present disclosure.

Referring to FIG. 2, a base substrate 200 may be provided (e.g, in Step S802 in FIG. 11).

For illustration purposes, the present disclosure is described by using an embodiment where the semiconductor device is a fin field effect transistor (FinFET) as an example. Correspondingly, the base substrate 200 may include a semiconductor substrate 201 and fins 202 on the semiconductor substrate.

The semiconductor substrate 201 may be made of a semiconductor material including single crystal silicon, polysilicon, amorphous silicon, germanium, SiGe, and/or GaAs. In one embodiment, the semiconductor substrate 201 may be made of single crystal silicon.

In one embodiment, the fins 202 may be formed by patterning the semiconductor substrate 201. In other embodiments, the fins 202 may be formed by forming a fin material layer on the semiconductor substrate 201 and patterning the fin material layer.

In one embodiment, an isolation structure 203 may be further formed on the semiconductor substrate 201. The isolation structure 203 may cover a portion of sidewalls of the fins 202, and may have a top surface lower than top surfaces of the fins 202.

The isolation structure 203 may be made of a material including $SiO_2$.

In other embodiments, the semiconductor device may be a planar MOS transistor, and the base substrate may be a planar semiconductor substrate.

Subsequently, a first dielectric layer may be formed on the base substrate and target gate structures may be formed in the first dielectric layer. A first groove may be formed in the first dielectric layer above the target gate structure.

Figure 3:
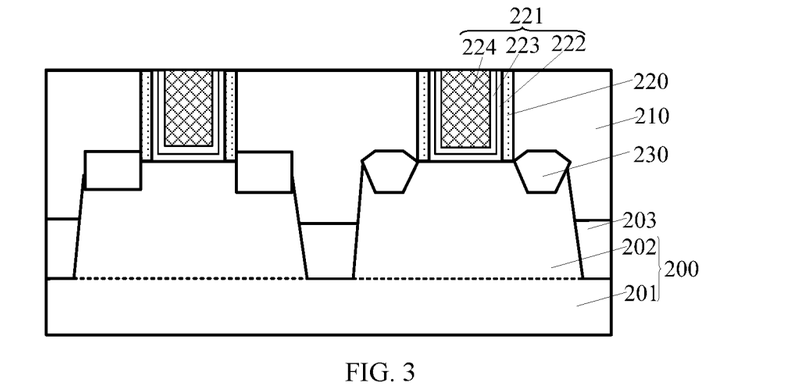

Referring to FIG. 3, a first dielectric layer 210 and initial gate structures may be formed on the base substrate 200 (e.g., in Step S804 in FIG. 11).

The initial gate structure may include an initial gate structure body 221 and an initial spacer wall 220 on sidewalls of the initial gate structure body 221.

In one embodiment, the initial gate structure body 221 may include an initial gate dielectric layer 222, an initial work function layer 223 on the initial gate dielectric layer, and an initial gate electrode layer 224 on the initial work function layer 223. In other embodiments, the initial gate structure body may only include an initial gate dielectric layer and an initial gate electrode layer on the initial gate dielectric layer.

In one embodiment, the initial gate structure body 221 may cross a fin 202, and may cover a portion of sidewalls of the fin 202 and a portion of a top surface of the fin 202. The initial gate dielectric layer 222 may cross the fin 202, and may be located on a top surface of a portion of the isolation structure 203. The initial gate dielectric layer 222 may cover a portion of sidewalls of the fin 202 and a portion of a top surface of the fin 202.

In one embodiment, the initial gate dielectric layer 222 may be made of a material including $SiO_2$, and the initial gate electrode layer 224 may be made of a material including polysilicon.

In one embodiment, when the semiconductor device is N-type, the initial work function layer 223 may be made of a material including TiAl. When the semiconductor device is P-type, the initial work function layer 223 may be made of a material including TiN.

The spacer walls 220 may be made of a material including $SiN_x$, $SiN_xO_y$, and/or BN. The first dielectric layer 220 may be made of $SiO_2$ and/or a low-k dielectric material with a dielectric constant smaller than 3.9.

The initial gate structures may be formed by: forming dummy gate structures on the base substrate 200; forming the initial spacer walls 220 on sidewalls of the dummy gate structures; forming source/drain doped regions 230 in the base substrate 200 on two sides of the dummy gate structure and the adjacent initial spacer wall 220; forming the first dielectric layer 210 on the base substrate and on the source/drain doped regions 230; removing the dummy gate structures to form gate openings; and forming an initial gate structure body 221 in the gate opening. The first dielectric layer 210 may cover sidewalls of the initial spacer wall 220, and may expose top surfaces of the initial spacer walls 220 and top surfaces of the dummy gate structures.

The source/drain doped regions 230 may be formed in the base substrate 200 on two sides of the dummy gate structure. In one embodiment, the source/drain doped regions 230 may be formed in the fins 202 on two sides of the dummy gate structure.

Subsequently, a partial height of the initial gate structure may be removed, to form a target gate structure and a first groove on the target gate structure.

The target gate structure may include a target gate structure body and a target spacer wall on sidewalls of the target gate structure body.

Figure 4:
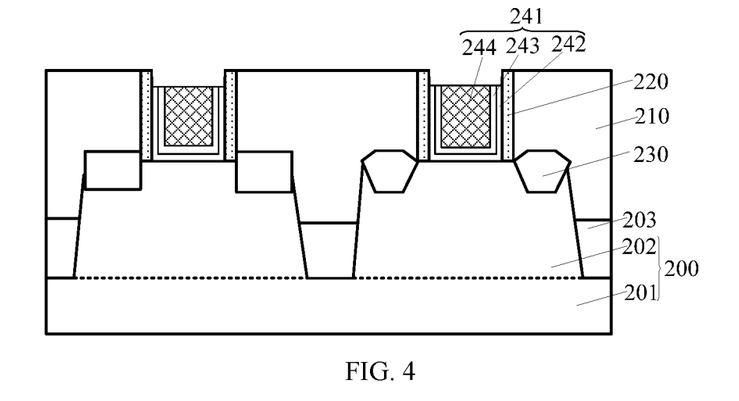
Figure 5:
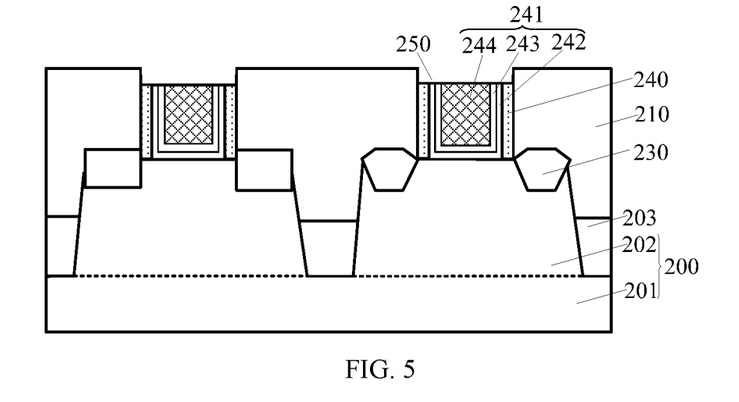

FIGS. 4-5 illustrate a process for removing a partial height of the initial gate structure (e.g., in Step S806 in FIG. 11).

Referring to FIG. 4, a portion of the initial gate structure body 221 may be removed to reduce a height of the initial gate structure body 221 to form the target gate structure body 241.

In one embodiment, the target gate structure body 241 may include a target gate dielectric layer 242, a target work function layer 243 on the target gate dielectric layer, and a target gate electrode layer 244 on the target work function layer 243. The target gate dielectric layer 242 may correspond to an initial gate dielectric layer 222, the target work function layer 243 may correspond to an initial work function layer 223, and the target gate electrode layer 244 may correspond to an initial gate electrode layer 224.

In other embodiments, the target gate structure body may only include a target gate dielectric layer and a target gate electrode layer on the target gate dielectric layer.

In one embodiment, the target gate structure body 241 may cross a fin 202, and may cover a portion of sidewalls and a portion of a top surface of the fin 202. The target gate dielectric layer 242 may cross the fin 202, and may be located on a top surface of a portion of the isolation structure 203. The target gate dielectric layer 222 may cover a portion of sidewalls and a portion of a top surface of the fin 202.

Referring to FIG. 5, after removing a portion of the initial gate structure body 221, a portion of the initial spacer wall 220 may be removed, to reduce a height of the initial spacer wall 220 and to form a target spacer wall 240.

In one embodiment, a portion of the initial spacer wall 220 may be removed by an anisotropic dry etching process. The dry etching process may use a gas based on carbon and fluorine, such as $CH_3F$.

The target gate structure may include a target gate structure body 241 and a target spacer wall 240 on sidewalls of the target gate structure body 241. The first dielectric layer 210 may include a first groove 250 on the target gate structure.

The source/drain doped regions 230 may be formed in the base substrate 200 on two sides of the target gate structure. In one embodiment, the source/drain doped regions 230 may be formed in the fin 202 on two sides of the target gate structure.

Figure 6:
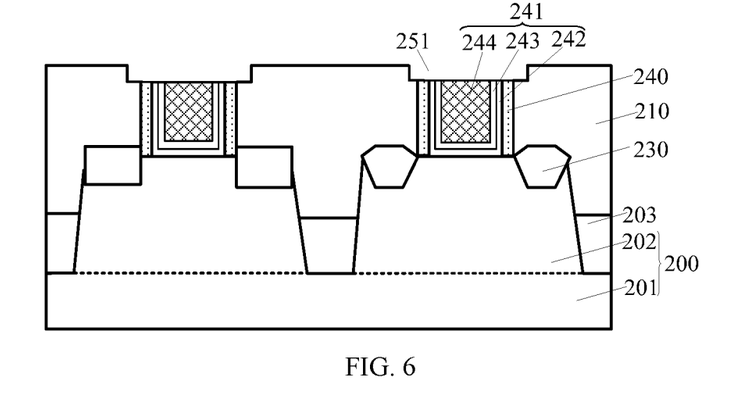

Referring to FIG. 6, a portion of the first dielectric layer 210 on the sidewalls of the first groove 250 (shown in FIG. 5) may be etched to expand an opening of the first groove 250 and to form a second groove 251 (e.g, in Step S808 in FIG. 11).

A portion of the first dielectric layer 210 on the sidewalls of the first groove 250 (shown in FIG. 5) may be etched to expand an opening of the first groove 250, e.g., by a wet etching process. The wet etching process may use a solution of HF.

The first groove 250 may have a first sidewall and a second side wall opposite to the first sidewall. The first sidewall and the second sidewall may be in parallel with an extending direction of the target gate structure.

When etching a portion of the first dielectric layer 210 on the sidewalls of the first groove 250, an etching amount of the first sidewall of the first groove 250 may be about 3 nm to about 10 nm, and an etching amount of the second sidewall of the first groove 250 may be about 3 nm to about 10 nm. The etching depth may expand the opening of the first groove 250, and may prevent an area of the second groove 251 projected to the surface of the source/drain doped region from being too large. As such, a protective layer to be formed may have a large size along a width direction of the target gate structure, and may have a small barrier on spaces of the conductive plugs to be formed.

Figure 7:
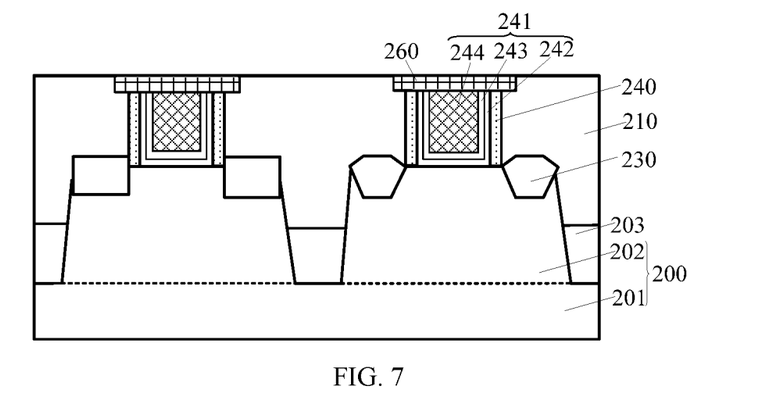

Referring to FIG. 7, a protective layer 260 may be formed in the second groove 251 (e.g., in Step S810 in FIG. 11). The protective layer 260 may have a dielectric constant larger than a dielectric constant of the first dielectric layer 210.

The protective layer 260 may be formed by: forming a protective material layer in the second groove 251 and on the first dielectric layer; and removing a portion of the protective material layer on the first dielectric layer 210.

The portion of the protective material layer on the first dielectric layer 210 may be removed by a planarizing process including a chemical mechanical polishing process and/or an etching back process.

In one embodiment, the protective layer 260 may have a relative dielectric constant of about 5.0 to about 7.4. In other embodiments, the relative dielectric constant of the protective layer 260 may be larger than 7.4, for example, may be about 10.

The protective layer 260 may be made of a material including $SiN_x$, SiNO and/or BN.

Subsequently, conductive plugs may be formed in the first dielectric layer 210 on sides of the target gate structure and the protective layer 260.

In one embodiment, before forming the conductive plugs, a second dielectric layer 270 may be formed on the first dielectric layer 210 and on the protective layers 270. The contact holes may penetrate through the first dielectric layer 210 and through the second dielectric layer 270. The contact holes may be formed on two sides of the target gate structure and of the adjacent protective layer 260. Bottoms of the contact holes may expose the corresponding source/drain doped regions 230. A conductive plug may be formed in the contact hole.

Figure 8:
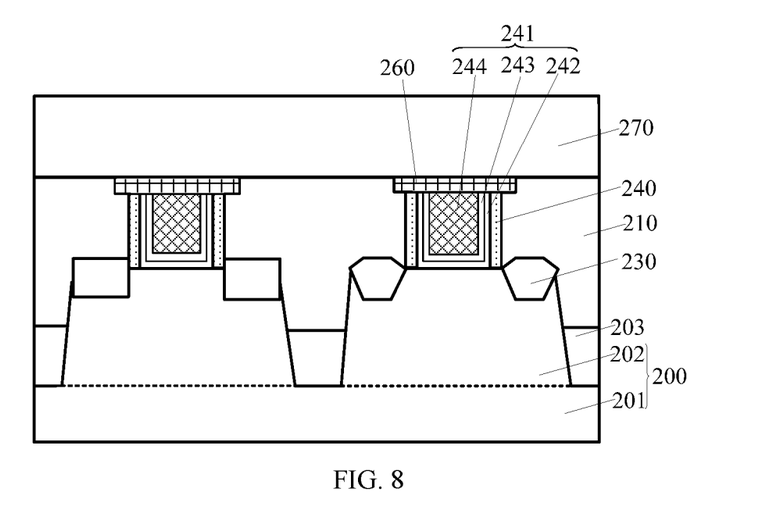

Referring to FIG. 8, the second dielectric layer 270 may be formed on the first dielectric layer 210 and on the protective layers 260 (e.g., in Step S812 in FIG. 11).

The second dielectric layer 270 may be made of $SiO_2$ or a low-k dielectric material with a relative dielectric constant smaller than 3.9.

The second dielectric layer 270 may be formed by a deposition process, for example, including a high-density plasma chemical vapor deposition process.

Referring to FIG. 9, the contact holes 280 may be formed on two sides of the target gate structure and the adjacent protective layer 260 (e.g., in Step S814 in FIG. 11). The contact holes 280 may penetrate through the first dielectric layer 210 and through the second dielectric layer 270. A bottom of the contact hole 280 may expose the corresponding source/drain doped region 230.

The first dielectric layer 210 and the second dielectric layer 270 on two sides of the target gate structure and the adjacent protective layer 260 may be etched by an anisotropic dry etching process, to form the contact holes 280.

Along a direction in parallel with the top surface of the base substrate and perpendicular to an extending direction of the target gate structures, the contact holes 280 may have a top size larger than a bottom size.

Referring to FIG. 10, a conductive plug 290 may be formed in the contact hole 280 (e.g., in Step S814 in FIG. 11).

Along a direction parallel to the top surface of the base substrate and perpendicular to an extending direction of the target gate structures, the conductive plug 290 may have a top size larger than a bottom size.

The conductive plug 290 may be made of a metal including tungsten, for example.

In one embodiment, a metal silicide layer may be formed on a surface of the source/drain doped region 230 under the corresponding contact hole 280. In other embodiments, the metal silicide layer may be not formed.

The metal silicide layer and the conductive plug may be formed by: forming a metal layer on sidewalls and on bottom of the contact hole 280, and on the second dielectric layer 270; reacting the metal layer with a material on the surface of the source/drain doped region 230, to form a metal silicide layer on the surface of the source/drain doped region 230 and under the adjacent contact hole 280; forming a conductive plug material layer on the second dielectric layer 270 and in the contact hole 280; and planarizing the metal layer and the conductive plug material layer to expose a top surface of the second dielectric layer 270 to form the conductive plug 290 from the conductive plug material layer in the contact hole 280.

In one embodiment, after forming the metal layer and before forming the conductive plug material layer, a barrier layer may be optionally formed on the second dielectric layer, on sidewalls and on the bottom of the contact hole 280; and the barrier layer may be planarized, when planarizing the metal layer and the conductive plug material layer to expose the top surface of the second dielectric layer 270. In other embodiments, the barrier layer may not be formed.

The barrier layer may be made of a material including TaN and/or TiN, for example.

In one embodiment, the metal layer and the barrier layer may be formed on sidewalls of the contact hole 280. After forming the conductive plugs, the metal layer an the barrier layer may be located between the protective layer 260 and the adjacent conductive plug 290. In other embodiments, no metal layer and no barrier layer may be located between the protective layer 260 and the adjacent conductive plug 290.

In other embodiments, after forming the metal silicide layer, the metal layer on sidewalls of the contact hole 280 may be removed, and the protective layer may be in contact with the adjacent conductive plug 290.

In one embodiment, a portion of the first dielectric layer 210 may be located between the protective layer 260 and the adjacent conductive plug 290. A size of the first dielectric layer 210 between the protective layer 260 and the adjacent conductive plug 290 may be above 2 nm, along a direction parallel to the top surface of the base substrate 200 and perpendicular to the extending direction of the target gate structure. As such, the process for forming the conductive plugs 290 may have a higher controllability, when a portion of the first dielectric layer 210 is between the protective layer 260 and the adjacent conductive plug 290.

In other embodiments, the protective layer 260 may be in contact with the adjacent conductive plug 290.

The present disclosure also provides a semiconductor device. Referring to FIG. 10, the semiconductor device may include: a base substrate 200, a first dielectric layer 210 on the base substrate, target gate structures in the first dielectric layer 210 and on the base substrate 200; a protective layer 260 on a top surface of the target gate structure; conductive plugs 290 in the first dielectric layer 210 on two sides of the target gate structure and the adjacent protective layer 260. The first dielectric layer 210 may include a first sub dielectric layer and a second sub dielectric layer on the first sub dielectric layer. The first sub dielectric layer may cover sidewalls of the target gate structures. The protective layer 260 may have a surface area covering and surrounding the top surface of the adjacent target gate. The second sub dielectric layer may cover sidewalls of the protective layers 260.

In one embodiment, a portion of the first dielectric layer 210 may be between the protective layer 260 and the adjacent conductive plug 290. A size of the first dielectric layer 210 between the protective layer 260 and the adjacent conductive plug 290 may be above 2 nm, along a direction parallel to the top surface of the base substrate 200 and perpendicular to the extending direction of the target gate structure.

In other embodiments, the protective layer 260 may be in contact with the adjacent conductive plug 290.

The protective layer 260 may have a relative dielectric constant of about 5.0 to about 7.4. The first dielectric layer 210 may be made of $SiO_2$ and/or a low-k dielectric material.

The protective layer 260 may be made of a material including $SiN_x$, $SiN_xO_y$, and/or BN.

The target gate structure may include a target gate structure body 241 and a target spacer wall 240 on sidewalls of the adjacent target gate structure body 241.

The semiconductor device may further include source/drain doped regions 230 in the base substrate 200 on two sides of the target gate structure. The semiconductor device may further include a metal silicide layer between the conductive plug 290 and the adjacent source/drain doped region 230.

In the fabrication method provided by various embodiments of the present disclosure, the first dielectric layer on the sidewalls of the first groove may be etched to expand the opening of the first groove to form the second groove. The protective layer may be formed in the second groove. A distance from the edge of the target gate structure to the edge of the adjacent conductive plug may be larger than a distance from the edge of the protective layer to the edge of the adjacent conductive plug. The dielectric constant of the protective layer may be greater than the dielectric constant of the first dielectric layer. The region between the top region of the target gate structure and the adjacent conductive plug may be hard to break down, and the leakage currents may be alleviated.

In the semiconductor devices provided by various embodiments of the present disclosure, a distance from the edge of the target gate structure to the edge of the adjacent conductive plug may be larger than a distance from the edge of the protective layer to the edge of the adjacent conductive plug. The dielectric constant of the protective layer may be larger than the dielectric constant of the first dielectric layer. The region between the top region of the target gate structure and the adjacent conductive plug may be hard to break down, and the leakage currents may be alleviated.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A semiconductor device, comprising:
    a base substrate;
    a first dielectric layer on the base substrate;
    a target gate structure in the first dielectric layer and on the base substrate, wherein the target gate structure includes a target structure body and a target spacer wall on sidewalls of the target gate structure body;
    a protective layer on a top surface of the target gate structure, the protective layer being embedded in the first dielectric layer only with a top surface of the protective layer exposed by the first dielectric layer, wherein:
    the protective layer has a bottom surface area covering and surrounding the top surface of the target gate structure body and a top surface of sidewalls of the target gate structure body, and the protective layer has a dielectric constant greater than the first dielectric layer and a width about 3 nm to 10 nm greater than a width of the target gate structure along a direction in parallel with a top surface of the base substrate and perpendicular to an extending direction of the target gate structure; and
    conductive plugs in the first dielectric layer on sides of the target gate structure and the protective layer, wherein the protective layer has a side surface in direct contact with sidewall of an adjacent conductive plug, a distance from an edge of the target gate structure to an edge of an adjacent conductive plug is larger than a distance from an edge of the protective layer to the edge of the adjacent conductive plug, and the protective layer has a uniform thickness and a bottom surface coinciding with the top surface of the target structure body and a top surface of the target spacer wall.

2. The device according to claim 1, wherein:
    a portion of the first dielectric layer is between the protective layer and an adjacent conductive plug.

3. The device according to claim 2, wherein:
    a portion of the first dielectric layer between the protective layer and the adjacent conductive plug has a size about 2 nm, along a direction parallel to a top surface of the base substrate and perpendicular to an extending direction of the target gate structure.

4. The device according to claim 1, wherein:
the protective layer has a relative dielectric constant of about 5.0 to about 7.4; and
the first dielectric layer is made of a material including $SiO_2$ and a low-k dielectric material.

5. The device according to claim 4, wherein:
the protective layer is made of $SiN_x$, $SiN_xO_y$, BN, or a combination thereof.

6. The device according to claim 1, wherein:
the conductive plug has a top size larger than a bottom size, along a direction parallel to a top surface of the base substrate and perpendicular to an extending direction of the target gate structure.

7. The device according to claim 1, wherein:
a top surface of the target structure body coincides with a top surface of the target spacer wall.

8. The device according to claim 1, wherein:
a portion of the first dielectric layer is surrounded directly only by the target gate structure, the protective layer, the conductive plugs, and the base substrate.

9. The device according to claim 8, wherein:
the base substrate includes source/drain doped regions on two sides of the target gate structure, and
the portion of the first dielectric layer is surrounded directly by the target gate structure, the protective layer, the conductive plugs, and the source/drain doped regions.

10. The device according to claim 9, further including:
a metal silicide layer, between the conductive plug and the source/drain doped regions.

11. The device according to claim 1, further including:
a second dielectric layer forming on the first dielectric layer and on the protective layer, wherein the conductive plug is formed on the source/drain doped regions through the first dielectric layer and the second dielectric layer, and on sides of each of the target gate structure and the protective layer.

12. The device according to claim 1, further including:
a metal layer, between the conductive plug and the first dielectric layer.

* * * * *